United States Patent [19]

Matsumura

[11] Patent Number: 4,827,158
[45] Date of Patent: May 2, 1989

[54] OUTPUT CIRCUIT USED IN AN OUTPUT STAGE WHERE LARGE CURRENT AND LARGE OUTPUT AMPLITUDE ARE REQUIRED

[75] Inventor: Ken Matsumura, Kanagawa, Japan

[73] Assignee: Kabushiki Kaisha Toshiba, Kawagawa, Japan

[21] Appl. No.: 215,857

[22] Filed: Jul. 6, 1988

[30] Foreign Application Priority Data

Aug. 12, 1987 [JP] Japan ................ 62-201305

[51] Int. Cl.[4] ............ H03K 3/01; H03K 5/22; G05F 3/16; H03F 3/04
[52] U.S. Cl. .................. 307/270; 307/455; 307/355; 307/359; 307/562; 307/565; 323/316; 330/288

[58] Field of Search ............ 307/270, 264, 494, 315, 307/254, 255, 455, 456, 457, 466, 467, 355, 358, 359, 562, 565; 323/316; 330/288

[56] References Cited

U.S. PATENT DOCUMENTS

| 4,591,741 | 5/1986 | Cooper | 307/456 |
| 4,684,831 | 8/1987 | Kruest | 323/316 |
| 4,721,867 | 1/1988 | Headen, Jr. et al. | 307/270 |
| 4,754,158 | 6/1988 | Halberstein | 307/254 |

*Primary Examiner*—Stanley D. Miller
*Assistant Examiner*—Trong Quang Phan
*Attorney, Agent, or Firm*—Finnegan, Henderson, Farabow, Garrett, & Dunner

[57] ABSTRACT

An output circuit comprises first and second transistors of opposite conductivity type supplied with an input signal. The collector electrodes of the first and the second transistors are connected to pull-up and pull-down transistors to drive them.

7 Claims, 2 Drawing Sheets

OUTPUT CIRCUIT USED IN AN OUTPUT STAGE WHERE LARGE CURRENT AND LARGE OUTPUT AMPLITUDE ARE REQUIRED

BACKGROUND OF THE INVENTION

1. Field of the Invention

This invention concerns an output circuit. More particularly, this invention concerns an output circuit which is used in an output stage where a large current and a large output amplitude are required, e.g., in a motor drive circuit.

2. Description of the Prior Art

Convention ally, a switching type output circuit or an analogue drive type output circuit has been used as an output circuit in a Output stage Of a brush-less motor drive circuit. In the switching type output circuit, an electric noise occurs. For reducing the noise and for obtaining a smooth operation of the motor, a large capacity capacitor is required. Thus, this switching type output circuit is not desireable from the stand point of size or cost. Therefore, to avoid the above defects, an analogue drive type output circuit is widely used.

FIG. 1 shows an example of an analogue drive type output circuit. In the circuit, a pull-up transistor Q10 and a pull-down transistor Q12 are controlled by an output signal of an amplifier circuit 11. A loop, including diodes D1 to D4 and transistors Q8 to Q11, is formed to control the current of the transistor Q10 when no input current is supplied to the input terminal T1 Namely, the current which flows in the transistor Q10 is controlled by changing the emitter area of each transistor. When a positive input current $Ii+$ is supplied to the input terminal T1, the input voltage Vin at the non-inverting input terminal is expressed as follows:

$$Vin = Vref + (Ii+) \times R2 \qquad (1)$$

wherein, Vref is the reference voltage supplied to a reference terminal. Thus, the Output of the amplifier circuit 11 becomes high level. There±ore, the current supplied by the current mirror circuit, including a current source I and PNP transistors Q5 and Q6, is supplied to the base electrode of the transistor Q9. Thus, the transistors Q9 and Q10 change to the ON state. In this condition, the transistors Q11 and Q12 are in the OFF state. When a negative current $I-$ is withdrawn from the input terminal T1, the input voltage Vin at the non-inverting input terminal of the amplifier i1 is expressed as follows:

$$Vin = Vref - (Ii-) \times R2 \qquad (2)$$

Thus, the output of the amplifier becomes a low level. In this state, the transistors Q11 and Q12 become ON state, and the transistors Q9 and Q10 are in the OFF state, respectively. This circuit as a whole forms an amplifier circuit. The relationship between the input current Ii and the output voltage Vo is expressed as follows:

$$R2.Ii = R3.Vo/(R3+R4) \qquad (3)$$

Thus the gain of this circuit is expressed as follows:

$$\begin{aligned} G &= Vo/R2 \cdot Ii \\ &= R2 \cdot (R3+R4)/R3 \end{aligned} \qquad (4)$$

By setting R2=R3, the gain G is expressed as follows:

$$G = R3 + R4 \qquad (5)$$

wherein R2, R3 and R4 are resistance values of the resistors R2, R3 and R4, respectively. In this way, an analogue drive type output circuit which supplies a large amplitude output voltage and a large current, is achieved. Thus, the electric noise created by the prior art switching type circuit is prevented, and a stabilized output is achieved. Furthermore, a sufficient output current, expressed as follows, is achieved:

$$Ic10 = Ic6 \times hfe9 \times hfe10 \qquad (6)$$

$$Ic12 = Ic7 \times hfe8 \times hfe12 \qquad (7)$$

wherein Ic10 and Ic12 are the collector currents of transistors Q10 and Q12, and hfe8, hfe9, hfe10 and hfe12 are the current gains of the transistors Q8, Q9, Q10 and Q12, respectively. The maximum output voltage Vmax at the output terminal T2 in the saturation state is expressed as follows:

$$Vmax = Vcc - Vbe10\,Vbe9 - Vces6 \qquad (8)$$

wherein the Vces6 is the collector-emitter voltage of the transistor Q6 in the saturation state thereof. The minimum output voltage Vmin is expressed as follows:

$$Vmin = Vces12 \qquad (9)$$

wherein the Vces12 is the collector-emitter voltage of the transistor Q12 in the saturation state thereof. As Vbe and Vces are about 0.7 (V) and 0.3 (V), respectively, the maximum output voltage Vmax is lowered by about 1.7 (V) with respect to the power source voltage Vcc. Recently, the requirement for lowering the power source voltage has been become more strict. For example, it is necessary to operate the output circuit at a power source voltage of 5 (V). e.g., in a floppy disk drive circuit. Thus, an output circuit which can supply an output current and an output voltage amplitude or a torque as large as possible, is required to sufficiently drive such a motor.

SUMMARY OF THE INVENTION

Therefore an object of this invention is to increase the output amplitude of an output circuit.

Another object of this invention is provide an analogue drive type output circuit which can supply a large output amplitude and a large current.

In according to this invention, an improved output circuit comprises, a first and a second power terminal means for supplying a first and a second power potentials, respectively; an output terminal means for outputting an output signal; a first transistor of first conductivity type, having a base electrode, a collector electrode and an emitter electrode, respectively; a second transistor of second conductivity type, having a base electrode, a collector electrode and an emitter electrode, respectively; a third transistor of first conductivity type, having a base electrode, a collector electrode and an emitter electrode, respectively; input signal supplying means for supplying an input signal to the base electrodes of said first and second transistors; a bias supplying means for supplying a bias voltage to the base electrode of said third transistor; first means for connecting the emitter electrodes of said first and third transistors to said second power terminal means; second means for connecting the emitter electrode of said second transistor to said first power terminal means; third means for connecting the collector electrode of said third transistor &o said first power terminal means: a first output transistor means for amplifying a collector current of said first transistor, and supplying the amplified current to said output terminal; and a second output transistor means for amplifying a collector current of said second transistor, and supplying the amplified current to said output terminal means.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 1:
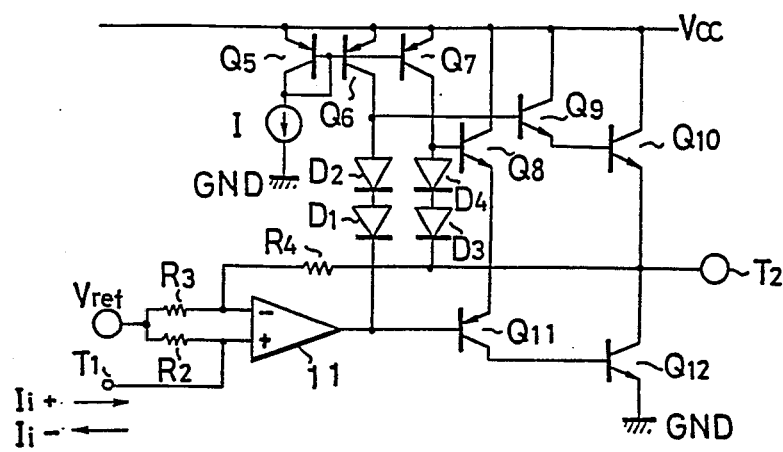
FIG. 1 is a circuit diagram of a conventional output circuit of an analogue drive type.
Figure 2:
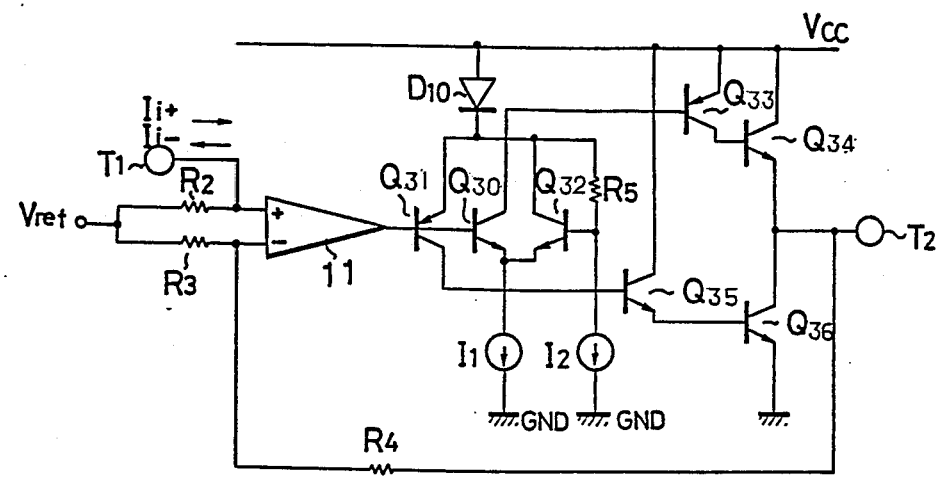
FIG. 2 is a circuit diagram of output circuit of this invention.

In FIG. 2, a first NPN transistor Q30 and a second transistor Q31 of PNP type are connected to an output terminal of the amplifier circuit 11, and are supplied with an output signal of the amplifier circuit 11. An emitter electrode of the transistor Q30 is connected to an emitter electrode of a third transistor Q32 of NPN type. The common connection of the emitter electrodes of the transistors Q30 and Q32 is connected to a ground terminal AND through a current source I1. The emitter electrode of the transistor Q31 is coupled to the Vcc terminal through a diode D10. The collector electrode of the transistor Q31 is connected to a base electrode of a transistor Q35. The collector electrode of the transistor Q35 is connected to the power terminal Vcc, and the emitter electrode thereof is connected to the base electrode of an NPN type pull-down transistor Q36. The transistors Q35 and Q36 are in a Darlington configuration.

The collector electrode of the transistor Q30 is connected to a base electrode of a PNP transistor Q33. The collector electrode of the transistor Q33 is connected to the Vcc terminal, and the collector electrode thereof is connected to the base electrode of a pull-up transistor Q34. The emitter electrode of the transistor Q34 is connected to the output terminal T2. A first terminal of a resistor R5 is connected to the cathode electrode of the diode D10, and the other end of the resistor R5 is connected to the base electrode of the transistor Q32 and to the GND terminal through a current source I2. The resistor R5 and the current source I2 form a bias circuit for the transistor Q32.

The amplifier circuit 11 includes an inverting input terminal (−) and a non-inverting input terminal (+). These input terminals are supplied with a reference voltage Vref through resistors R2 and R3, respectively. The non-inverting input terminal (+) is connected to an input terminal TI, and supplied with an input current.

The inverting input terminal (−) of the amplifier circuit 11 is connected to the output terminal T2 through a feedback resistor R4. In this circuit, the pull-up transistor Q34 and the pull-down transistor Q36 are driven by the transistors Q30 and Q31. The &transistors Q30 and Q31 are supplied with the output signal of the amplifier circuit 11 at the base electrodes thereof. When a positive input current I+ is supplied to the input terminal T1, the input input voltage Vin at the non-inverting input terminal (+) of the amplifier circuit 11 becomes as follows:

$$Vin = Vref + (Ii+) \times R2 \qquad (10)$$

wherein R2 is the resistance value of the resistor R2. IN this condition, the output of the amplifier circuit 11 becomes a high level. Thus, the transistors Q30, Q33 and Q34 change to the ON state to make the output at the output terminal T2 a high level. In this condition, the transistors Q31, Q35 and Q36 are in the OFF state. The condition to change the NPN transistor to the Q30 ON state is expressed as follows:

$$V1 > Vcc - Vf - I2.R5 - Vbe32 + Vbe30 \qquad (11)$$

wherein,
V1: the output voltage of the amplifier circuit Ii
Vf: the forward voltage of the diode D10.
I2: the current value of the current source I2
R2: the resistance value of the resistor R2
Vbe30, Vbe32: the base-emitter voltage of the transistors Q30 and Q32, respectively.

When a negative input current Ii− is withdrawn from the input terminal T1, a voltage drop expressed as (Ii−)×R2 is developed at the resistor R2. This voltage drop decreases the input voltage at the input terminal of the amplifier circuit 11, and also makes the output of the amplifier circuit 11 a low level. The condition, when the transistor Q31 is ON, is as follows.

$$V1 < Vcc - Vf - Vbe31 \qquad (12)$$

As is apparent from the equations (11) and (12), an extent V where the both transistors Q30 and Q31 are OFF is expressed as follows, by assuming the base-emitter voltage of each transistor is same:

$$V = -I2.R5 + Vbe32 \qquad (13)$$

Thus, by setting the Vbe32 to be greater than I2.R5, the current which flows the output transistor Q34, when no input current is supplied to the input terminal Ti, is controlled. The diode D10 is used to insure the transistors Q30, Q33 and Q34 are in the ON state in accordance with the relationship:

$$Vces30 + Vbe33 < Vbe32 + I2.R5 + Vf \qquad (14)$$

wherein, Vces30 is the collector-emitter voltage of the transistor Q30 at the saturation state thereof, and Vbe33 is the base-emitter voltage of the transistor Q33. In this circuit, the PNP transistor 033, which drives the pull-up transistor 034, is driven by the NPN transistor Q30. Thus, only the emitter-collector path of the transistor Q33 and the base-emitter path of the transistor Q34 exist between the output terminal T2 and the power source terminal Vcc. Therefore, the maximum output voltage Vmax at the output terminal T2 is expressed as follows:

$$Vmax = Vcc - Vbe34 - Vces33 \quad (15)$$

wherein the Vces33 is the collector-emitter voltage of the transistor Q33 in the saturation state. The minimum voltage Vmin is expressed as follows.

$$Vmin = Vces36 \quad (16)$$

wherein the Vces36 is the collector-emitter voltage of the transistor Q36 at the saturation state thereof. As is apparent from equations (8) and (15), the amplitude of the output is increased in this circuit with respect to the prior art output circuit. This increase is significant at lower power source voltages. The output current, namely one of the collector currents of the output transistors Q34 and Q36, is expressed as follows:

$$Ic34 \approx Ie34 = I1 \times hfe33 \times hfe34 \quad (17)$$

$$Ic36 = Ic31 \times hfe35 \times hfe36 \quad (18)$$

Thus, sufficient output current is also achieved. This circuit as a whole forms an amplifier circuit. The relationship between the input current Ii and the output voltage Vo is expressed as follows:

$$R2.Ii = R3.Vo/(R3+R4) \quad (19)$$

Thus the gain of this circuit is expressed as follows:

$$\begin{aligned} G &= Vo/R2 \cdot Ii \\ &= R2 \cdot (R3 + R4)/R3 \end{aligned} \quad (20)$$

By setting R2=R3, the gain G is expressed as follows $$G = R3 + R4 \quad (21)$$

wherein R2, R3 and R4 are resistance values of the resistors R2, R3 and R4, respectively. In this way, an analogue drive type output circuit which supplies a large amplitude output voltage and a large current, is achieved.

Figure 3:
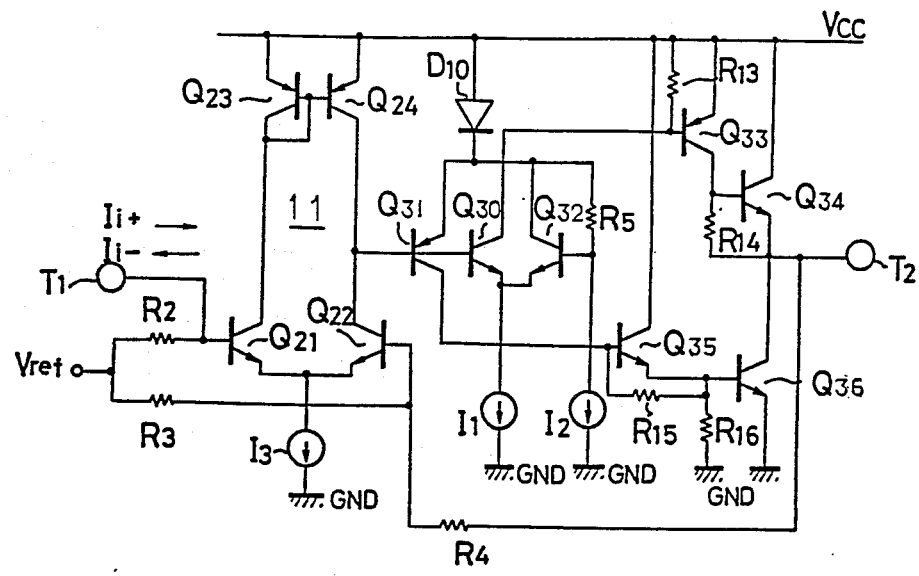
FIG. 3 is a circuit diagram of another embodiment of this invention.

FIG. 3 is a circuit diagram of another embodiment of this invention. In this circuit, as the amplifier circuit 11, a pair of NPN transistors Q21 and Q22 and a current mirror circuit, including PNP transistors Q23 and Q24 are used. Resistors R13 to R16, which are connected between the base-emitter electrodes of transistors Q33, Q34, Q35 and Q36, are adopted to avoid a mis-operation caused by a leak current.

Figure 4:
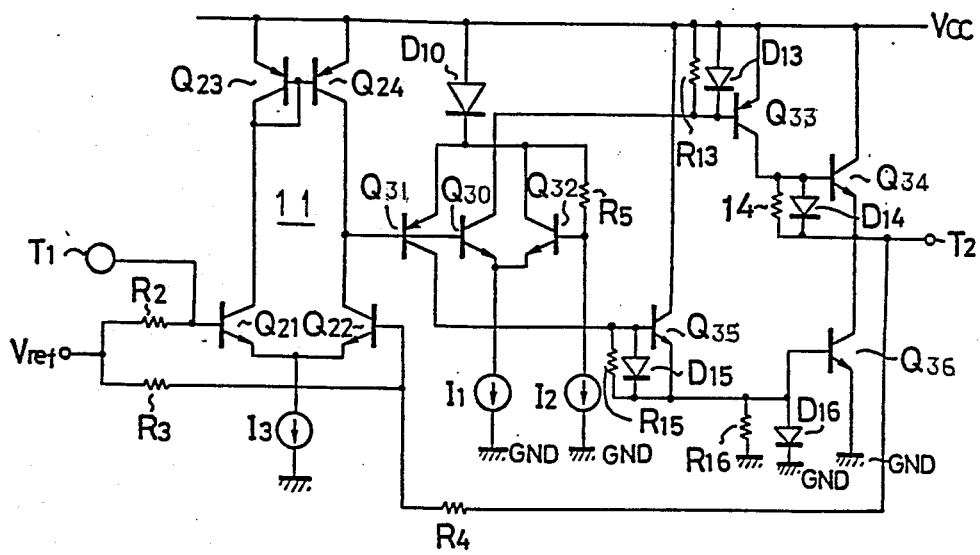
FIG. 4 is a circuit diagram of further embodiment of this invention.

FIG. 4 is a further embodiment of this invention. In this circuit, diodes D13, D14, D15 and D16 are connected in parallel to the resistors R13 to R16, respectively. By adding these diodes, the input current to the transistors Q33 to Q36 is reduced. Thus, the output impedance of the amplifier circuits is reduced, and the phase shift at the respective transistor is suppressed. Therefore, local oscillation at the respective transistor, due to the phase shift, is suppressed Thus, a stabilized output is obtained.

The present invention has been described with respect to a specific embodiment. However, other embodiments based on the principles of the present invention should be obvious to those of ordinary skill in the art. Such embodiments are intended to be covered by the claims.

What is claimed is:

1. An output circuit, comprising:
    a first and a second power terminal means for supplying a first and a second power potentials, respectively;
    an output terminal means for outputting an output signal:
    a first transistor of first conductivity type, having a base electrode a collector electrode and an emitter electrode, respectively;
    a second transistor of second conductivity type, having a base electrode, a collector electrode and an emitter electrode, respectively;
    a third transistor of first conductivity type, having a base electrode, a collector electrode and an emitter electrode, respectively;
    input signal supplying means for simultaneously supplying an input signal to the base electrodes of said first and second transistors;
    a bias supplying means for supplying a bias voltage to the base electrode of said third transistor;
    first means for connecting the emitter electrodes of said first and third transistors to said second power terminal means;
    second means for connecting the emitter electrode of said second transitor to said first power terminal means, and for connecting the collector electrode of said third transistor to said first power terminal means;
    a first output transistor means for amplifying the collector current of said first transistor, and supplying the amplified current to said output terminal; and
    a second output transistor means for amplifying the collector current of said second transistor, and supplying the amplified current to said output terminal means.

2. The output circuit of claim 1, wherein the input signal supplying means comprises:
    an amplifier circuit having an inverting input terminal, a non-inverting terminal, and first and second resistors, the non-inverting input terminal being supplied with a reference voltage through the first resistor and an input current, the inverting terminal being supplied with the reference voltage through the second resistor.

3. The output circuit of claim 1, wherein the bias supplying means comprises:
    a first current source connected between the base electrode of said third transistor, and a resistor connected between the collector electrode and the base electrode of the third transistor.

4. The output circuit of claim 1, wherein the second means comprises a diode.

5. The output circuit of claim 2, wherein the amplifier circuit includes a third resistor, and the inverting input terminal of the amplifier circuit is connected to the output terminal through the third resistor.

6. The output circuit of claim 1, wherein the first output transistor means comprises:
    a fourth transistor of the second conductivity type, having a base electrode connected to the collector electrode of said first transistor, an emitter electrode connected to the first power terminal means and a collector electrode;
    a fifth transistor having a base electrode connected to the collector electrode of said fourth transistor, a collector electrode connected to the first power terminal means and an emitter electrode connected to said output terminal;

said second output transistor means comprising a sixth transistor of the first conductivity type, having a base electrode connected to the collector electrode of the second transistor, a collector electrode connected to the first power terminal means and an emitter electrode a seventh transistor of the first conductivity type, having a base electrode connected to the emitter electrode of the sixth transistor, a collector electrode connected to the output terminal and an emitter electrode connected to the second power terminal means.

7. The output circuit of claim 6, wherein the first output circuit further comprises a fifth resistor connected between the base and the collector electrode of the fourth transistor, and a sixth resistor connected between the base and the emitter electrodes of the fifth transistor; and the second output circuit comprises a seventh resistor connected between the base and the emitter electrodes of the sixth transistor.

* * * * *